(12) United States Patent
Wang

(10) Patent No.: US 11,837,497 B2
(45) Date of Patent: Dec. 5, 2023

(54) SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 146 days.

(21) Appl. No.: 17/447,349

(22) Filed: Sep. 10, 2021

(65) Prior Publication Data
US 2021/0407846 A1 Dec. 30, 2021

Related U.S. Application Data

(62) Division of application No. 16/747,699, filed on Jan. 21, 2020, now Pat. No. 11,158,532.

(30) Foreign Application Priority Data
Jan. 31, 2019 (CN) .......................... 201910097624.2

(51) Int. Cl.
H01L 21/762 (2006.01)
H01L 21/02 (2006.01)
H01L 21/8234 (2006.01)
H01L 21/033 (2006.01)

(52) U.S. Cl.
CPC .. *H01L 21/76224* (2013.01); *H01L 21/02381* (2013.01); *H01L 21/0337* (2013.01); *H01L 21/7624* (2013.01); *H01L 21/823481* (2013.01)

(58) Field of Classification Search
None
See application file for complete search history.

(56) References Cited

U.S. PATENT DOCUMENTS

| | | |
|---|---|---|
| 2017/0154962 A1 | 6/2017 | Zhou |
| 2020/0091319 A1* | 3/2020 | Bao .................... H01L 21/76205 |
| 2020/0152734 A1 | 5/2020 | Frougier et al. |
| 2020/0227306 A1 | 7/2020 | Cheng et al. |
| 2020/0357884 A1 | 11/2020 | Xie et al. |

* cited by examiner

*Primary Examiner* — Asok K Sarkar
(74) *Attorney, Agent, or Firm* — Anova Law Group, PLLC

(57) ABSTRACT

The present disclosure provides a semiconductor device. The semiconductor device includes a substrate, including a plurality of protrusions; a plurality of fins formed over the substrate and aligned with the plurality of protrusions; and an isolation structure formed on the substrate and between the protrusions and the fins. An orthographic projection of each of the plurality of fins and an orthographic projection of a corresponding protrusion of the plurality of protrusions on the substrate coincide with each other.

7 Claims, 5 Drawing Sheets

SEMICONDUCTOR DEVICE

CROSS-REFERENCES TO RELATED APPLICATION

This application is a divisional application of U.S. patent application Ser. No. 16/747,699, filed on Jan. 21, 2020, which claims the priority of Chinese Patent Application No. 201910097624.2, filed on Jan. 31, 2019, the content of which is incorporated herein by reference in its entirety.

TECHNICAL FIELD

The present disclosure generally relates to the field of semiconductor manufacturing and, in particular, to a semiconductor device and a fabrication method thereof.

BACKGROUND

With rapid development of semiconductor manufacturing technologies, semiconductor devices are moving in a direction toward higher component densities and higher integration. Semiconductor devices, as the most basic devices, are widely used. A traditional planar device has weak control of a channel current, resulting in short-channel effects and a leakage current, which ultimately affects electrical performance of a semiconductor device.

To overcome the short-channel effects of a device and suppress the leakage current, a conventional method proposes a fin field effect transistor (Fin FET), which is a common multi-gate device, and structures of the Fin FET include fins and an isolation layer on a surface of a semiconductor substrate, that the isolation layer covers a portion of sidewalls of the fins, and a surface of the isolation layer is lower than a top of the fins; gate structures on the surface of the isolation layer, and the top and the side walls of the fins; and source and drain regions in the fins on both sides of the gate structures. The gate structures of the Fin FET has a weak control ability on the fins covered by the isolation structure, especially a bottom of the fins covered by the isolation structure, and a leakage current of an off state of the semiconductor device is difficult to control. To reduce the leakage current of the off state of the Fin FET, SOI (Silicon-On-Insulator) technology can be used.

However, there is a need to improve performance of the semiconductor device fabricated by the conventional methods.

SUMMARY

One aspect of the present disclosure provides a fabrication method of a semiconductor device, including: providing a substrate; forming initial fins on the substrate, that the initial fins include a sacrificial material layer and a first material layer on a surface of the sacrificial material layer, first trenches are formed between adjacent initial fins, and a bottom of the first trenches exposes the substrate; forming a first layer in the first trenches; forming second trenches in the initial fins, that a bottom of the second trenches exposes the substrate, the sacrificial material layer between the second trenches and the first trenches is formed into a sacrificial fin layer, the first material layer between the second trenches and the first trenches is formed into fins, and the fins are located on a surface of the sacrificial fin layer; removing the sacrificial fin layer to form first fin openings between the substrate and the fins; and forming an isolation structure on the substrate and in the first fin openings.

Another aspect of the present disclosure provides a semiconductor device, including: a substrate, including protrusions; fins formed over the substrate and aligned with the protrusions, wherein orthographic projections of a fin and a protrusion on the substrate coincide with each other; and an isolation structure, formed on the substrate and between the protrusions and the fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

A semiconductor device is often formed by: providing a SOI substrate, that the SOI substrate includes a silicon substrate, an insulating oxide layer on a surface of the silicon substrate, and a monocrystalline silicon layer on a surface of the insulating oxide layer; and etching the monocrystalline silicon layer on the SOI to form fins.

The conventional method for fabricating the SOI substrate is to implant a buried oxide layer in the silicon substrate, which is a complicated process and has high costs, thereby restricting development of the semiconductor device on the SOI substrate.

In a fabricating method provided by the present disclosure, by forming initial fins on a substrate, that the initial fins include a sacrificial material layer and a first material layer on a surface of the sacrificial material layer; forming second trenches in the initial fins to form fins and a sacrificial fin layer; removing the sacrificial fin layer to form first fin openings between the substrate and the fins; and forming an isolation structure on the substrate and in the first fin openings, a silicon semiconductor device on an insulating substrate is fabricated. The method improves the performance of the semiconductor device.

The above described objects, features and advantages of the present disclosure may become easier to be understood from the embodiments of the present disclosure described in detail below with reference to the accompanying drawings.

FIGS. 1 to 9 illustrate structures corresponding to certain stages during an exemplary fabrication process of a semiconductor device consistent with various disclosed embodiments of the present disclosure.

Figure 10:
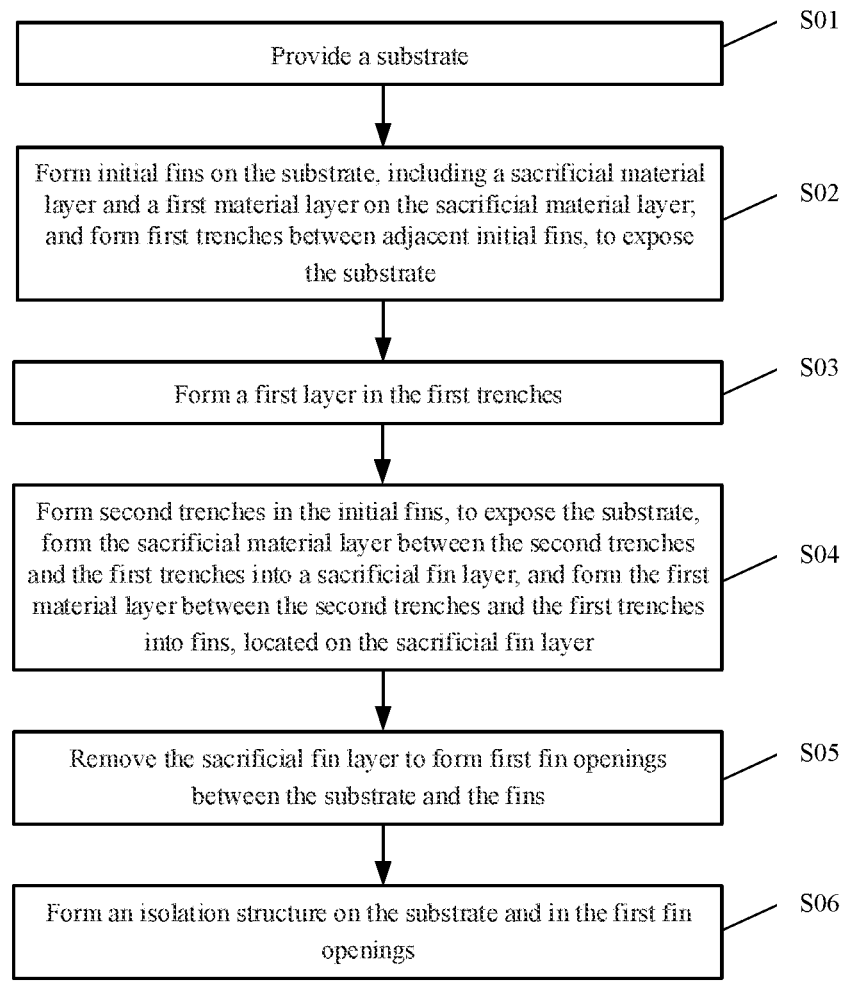
FIG. 10 illustrates an exemplary fabrication process of a semiconductor device consistent with various disclosed embodiments of the present disclosure.

FIG. 10 illustrates an exemplary fabrication process of a semiconductor device consistent with various disclosed embodiments of the present disclosure.

Figure 1:
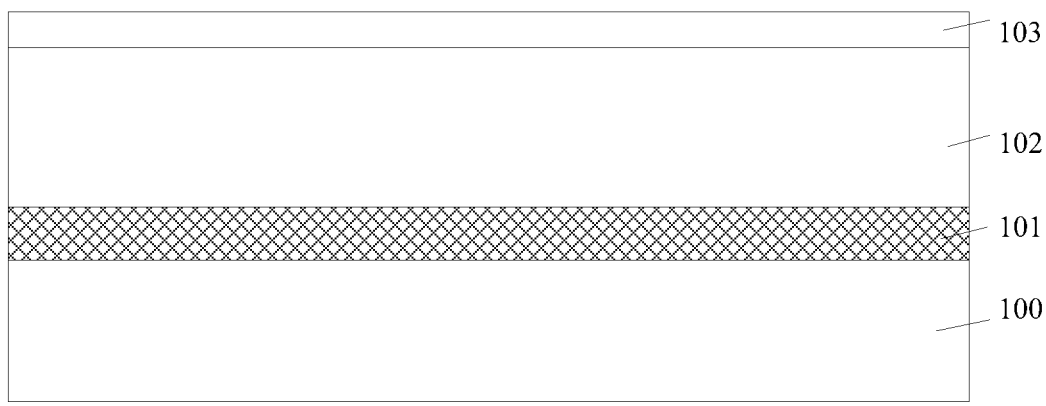
FIGS. 1 to 9 illustrate structures corresponding to certain stages during an exemplary fabrication process of a semiconductor device consistent with various disclosed embodiments of the present disclosure.

Referring to FIG. 1 and FIG. 10, a substrate 100 is provided (S01).

The substrate 100 is made of monocrystalline silicon. The substrate 100 may also be made of one of polysilicon and amorphous silicon. The substrate 100 may also be made of a semiconductor material such as one of germanium, silicon germanium, gallium arsenide, and the like.

In one embodiment, the substrate 100 is made of monocrystalline silicon.

An initial sacrificial material layer 101 is formed on the substrate 100, and the initial sacrificial material layer 101 and the substrate 100 are made of different materials.

The initial sacrificial material layer 101 is made of silicon germanium. The initial sacrificial material layer 101 may also be made of a semiconductor material such as one of germanium, silicon germanium, gallium arsenide, and the like.

The initial sacrificial material layer 101 provides a space for subsequent formation of first fin openings.

In one embodiment, the initial sacrificial material layer 101 is made of silicon germanium.

An initial first material layer 102 is formed on the initial sacrificial material layer 101, and the initial first material layer 102 and the initial sacrificial material layer 101 are made of different materials.

The initial first material layer 102 is made of monocrystalline silicon. The initial first material layer 102 may also be made of one of polysilicon and amorphous silicon. The initial first material layer 102 may also be made of a semiconductor material such as one of germanium, silicon germanium, gallium arsenide, and the like.

The initial first material layer 102 provides a material layer for subsequent formation of fins.

In one embodiment, the initial first material layer 102 and the substrate 100 are made of a same material. The initial first material layer 102 is made of monocrystalline silicon.

In other embodiments, the initial first material layer 102 and the substrate 100 may be made of different materials.

In one embodiment, the method further includes: forming an initial protective layer 103 on a surface of the initial first material layer 102.

The initial protective layer 103 provides a material layer for subsequent formation of a protective layer.

The initial first material layer 102 and the initial sacrificial material layer 101 are etched to form initial fins with first trenches between adjacent initial fins, that a bottom of the first trenches exposes the substrate 100.

Figure 2:
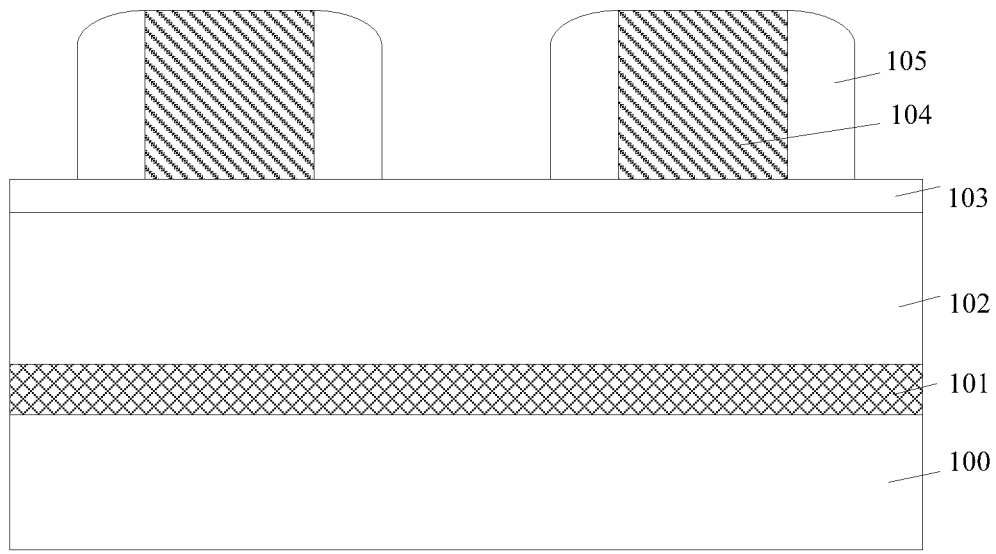

Referring to FIG. 2, a first auxiliary pattern layer 104 is formed on the initial first material layer 102, that the first auxiliary pattern layer 104 covers a portion of a surface of the initial first material layer 102. A first mask layer 105 is formed on sidewalls of the first auxiliary pattern layer 104.

The first auxiliary pattern layer 104 provides assistance for forming the first mask layer 105, and the first auxiliary pattern layer 104 and the first mask layer 105 determine positions and shapes of the initial fins that are subsequently formed.

A distance between adjacent first auxiliary pattern layers 104 is equal.

A method for forming the first auxiliary pattern layer 104 includes: forming a first auxiliary pattern film (not shown) on the initial first material layer 102; forming a first pattern layer (not shown) on a surface of the first auxiliary pattern film, that the first pattern layer exposes a portion of a surface of the first auxiliary pattern film; and etching the first auxiliary pattern film by using the first pattern layer as a mask until a surface of the initial first material 102 is exposed, to form the first auxiliary pattern layer 104 on the surface of the initial first material layer 102.

In one embodiment, a first auxiliary pattern film is formed on a surface of the initial protection layer 103. The first auxiliary pattern film is etched by using a first pattern layer as a mask until a surface of the initial protection layer 103 is exposed, to form the first auxiliary pattern layer 104 on the surface of the initial protective layer 103.

The first auxiliary pattern layer 104 may be made of one of amorphous carbon and amorphous silicon.

In one embodiment, the first auxiliary pattern layer 104 is made of amorphous carbon.

A first mask layer 105 determines positions and shapes of the fins.

A method for forming the first mask layer 105 includes: forming an initial first mask layer (not shown) on a surface of the initial first material layer 102, that the initial first mask layer covers a top and sidewalls of the first auxiliary pattern layer 104; and etching back the initial first mask layer to expose the top of the first auxiliary pattern layer 104, to form the first mask layer 105 on the sidewalls of the first auxiliary pattern layer 104.

The first mask layer 105 may be made of one of silicon nitride, silicon oxide, silicon oxynitride, silicon borohydride, silicon oxynitride, and silicon oxynitride.

In one embodiment, the first mask layer 105 is made of silicon nitride.

In another embodiment, after a first mask layer is formed, a first auxiliary pattern layer is removed. A method for forming initial fins includes: after the first mask layer is formed, before the first auxiliary pattern layer is removed, by using the first auxiliary pattern layer and the first mask layer as masks, etching an initial first material layer and an initial sacrificial material layer to form the initial fins on a substrate, that first trenches are formed between adjacent initial fins, and a bottom of the first trenches exposes the substrate.

Figure 3:
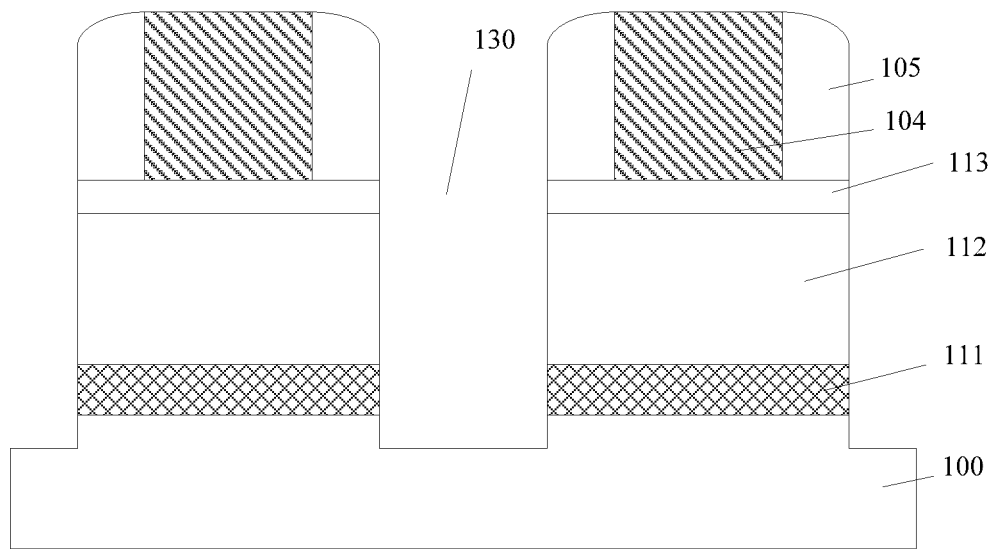

Referring to FIG. 3 and FIG. 10 (S02), after the first mask layer 105 is formed, the initial first material layer 102 and the initial sacrificial material layer 101 are etched by using the first auxiliary pattern layer 104 and the first mask layer 105 as masks, to form initial fins on the substrate, that first trenches 130 are formed between adjacent initial fins, and a bottom of the first trenches 130 exposes the substrate 100.

The initial first material layer 102 and the initial sacrificial material layer 101 are etched such that the initial first material layer 102 is formed into a first material layer 112, and the initial sacrificial material layer 101 is formed into a sacrificial material layer 111. The initial fins include the sacrificial material layer 111 and the first material layer 112 on the sacrificial material layer 111.

A thickness of the sacrificial material layer 111 is about 5 nm to about 100 nm.

The first trenches 130 expose sidewalls of the initial fins.

A process of etching the initial first material layer 102 and the initial sacrificial material layer 101 includes an anisotropic dry etching.

In one embodiment, the initial first material layer 102, the initial sacrificial material layer 101, and a portion of the substrate 100 are etched to form the initial fins.

Figure 4:
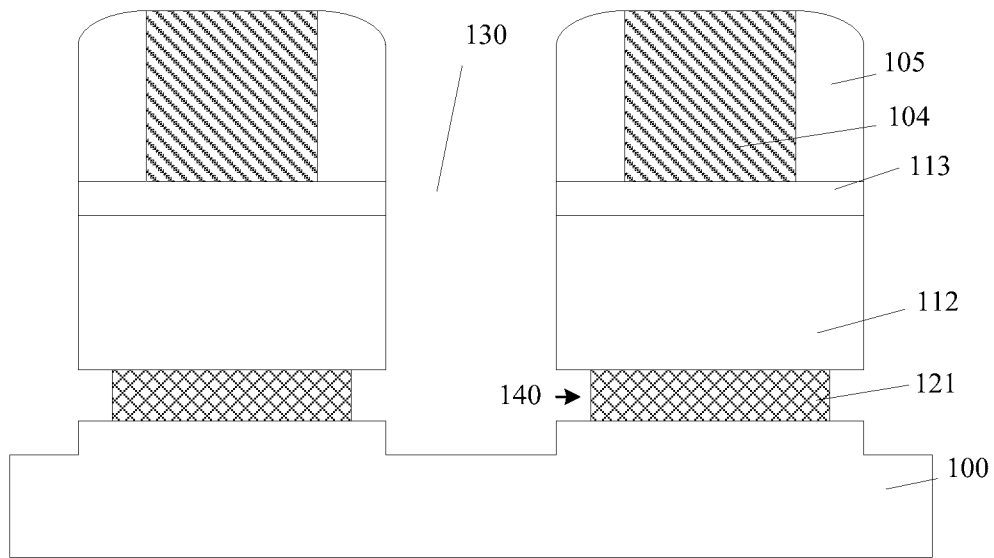

Referring to FIG. 4, after the initial fins are formed, a portion of the sacrificial material layer 111 of the initial fins exposed by the first trenches 130 is removed, to form second fin openings 140 into corresponding sidewalls of the first trenches 130 and, between the first material layer 112 and the substrate 100.

The portion of the sacrificial material layer 111 of the initial fins exposed by the first trenches 130 is removed such that the sacrificial material layer 111 is formed into a first sacrificial layer 121, and sidewalls of the first sacrificial layer 121 are recessed relative to the first material layer 112 of the initial fins.

The second fin openings 140 provide a space for subsequent formation of an isolation structure.

A process of removing a portion of the sacrificial material layer 111 of the initial fins exposed by the first trenches 130 is a wet etching process. A solution of the wet etching process for removing a portion of the sacrificial material layer 111 has a good selection ratio of silicon and silicon germanium, and can ensure that the silicon morphology is not affected while removing the silicon germanium. Parameters of the wet etching process for removing a portion of the sacrificial material layer 111 in one embodiment include: a HCl gas solution as an etching solution, a temperature between about 25 degrees Celsius to about 300 degrees Celsius, and a volume percentage of the HCl gas solution between about 20% to about 90%.

In one embodiment, the sacrificial material layer 111 is made of silicon, the first material layer 112 is made of silicon germanium, and an etching solution with MCI has a good selection ratio.

In another embodiment, second fin openings are not formed.

Figure 5:
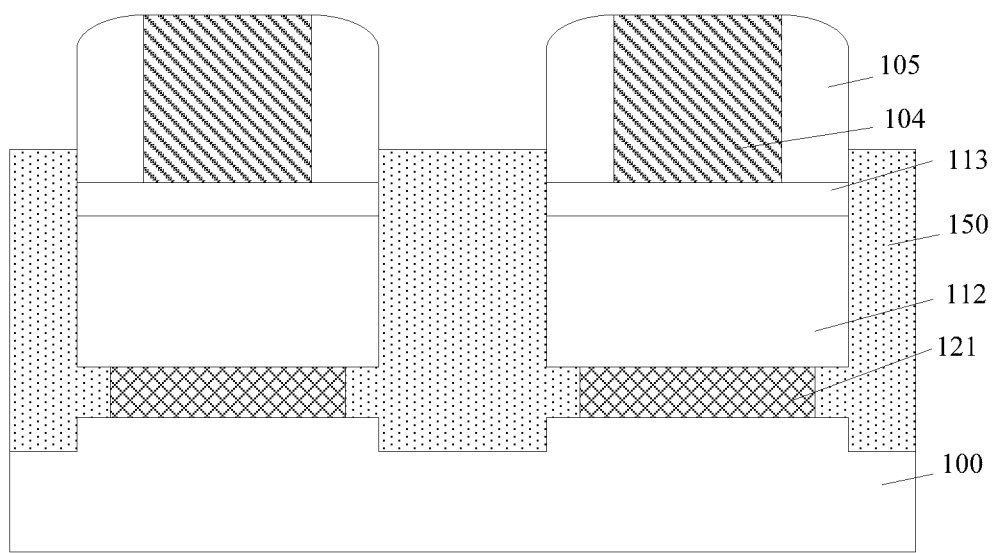

Referring to FIG. 5 and FIG. 10, a first layer 150 is formed in the first trenches 130 (S03).

The first layer 150 is made of one of silicon oxide, silicon nitride, silicon oxynitride, silicon borohydride, silicon oxynitride, and silicon oxynitride.

In one embodiment, the first layer 150 is made of silicon oxide.

In one embodiment, the method further includes forming the first layer 150 in the second fin openings 140.

A method of forming the first layer 150 includes: forming a first isolation film (not shown) on the substrate 100 and in the first trenches 130 to cover the initial fins; and etching back the first isolation film, to form the first layer 150.

A process of forming the first isolation film is a deposition process such as a fluid chemical vapor deposition process. The first isolation film is formed by the fluid chemical vapor deposition process, so that filling performance of the first isolation film is better.

The first layer 150 provides a material layer for subsequent formation of an isolation structure.

A subsequent removal of a sacrificial fin layer 131 forms first tin openings between fins 122 and the substrate 100, and the first layer 150 supports the fins 122.

In another embodiment, a first layer serves as a sacrificial layer, and the first layer is made of one of SiC and GaAs.

Figure 6:
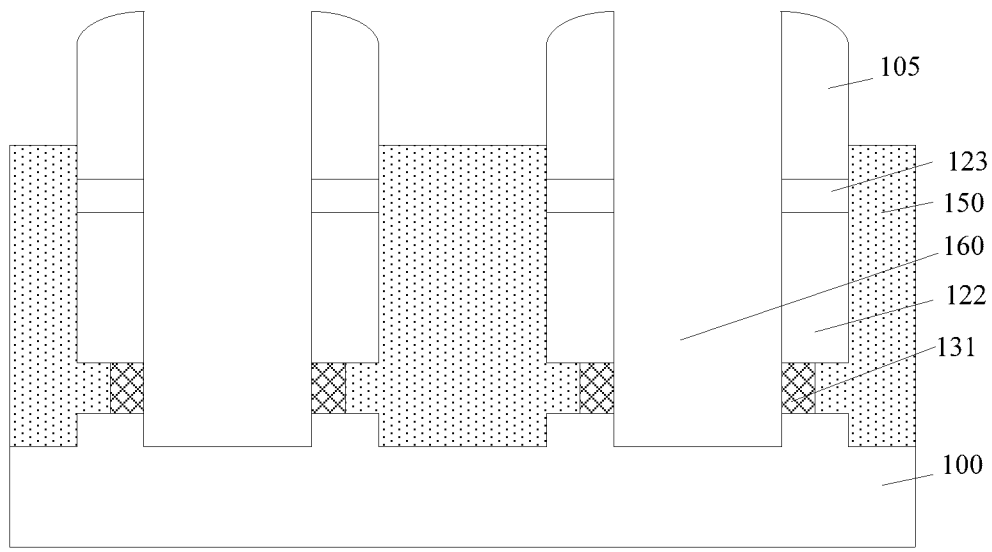

Referring to FIG. 6, after the first layer 150 is formed, the first auxiliary pattern layer 104 is removed to expose a portion of a surface of the initial fins. Referring to FIG. 6, after the first auxiliary pattern layer 104 is removed, the initial fins are etched by using the first mask layer 105 as a mask, to form second trenches 160 in the initial fins, that a bottom of the second trenches 160 exposes the substrate 100. As such, the second trench 160 may pass through the first material layer 112 and first sacrificial layer 121 and into the substrate 100, to form fins 122 (from the first material layer 112) and a sacrificial fin layer 131 (from the first sacrificial layer 121). The fins 122 are formed on the sacrificial fin layer 131 (S04).

The second trenches 160 expose sidewalls of the fins 122. The sacrificial fin layer 131 is located between the substrate 100 and the fins 122.

In another embodiment, second fin openings may not be formed, second trenches are formed in initial fins, a bottom of the second trenches exposes the substrate, such that a sacrificial material layer between the second trenches and first trenches is formed into a sacrificial fin layer, and a first material layer between the second trenches and the first trenches is formed into fins that are on a surface of the sacrificial fin layer.

A process of etching the first material layer 112 of the initial fins and the first sacrificial layer 121 of the initial fins includes an anisotropic dry etching.

In another embodiment, a method of forming second trenches includes: after a first layer is formed, forming a second mask layer on a surface of initial fins, that the second mask layer exposes a portion of the surface of the initial fins; and etching the initial fins by using the second mask layer as a mask to form the second trenches on a substrate.

Figure 7:
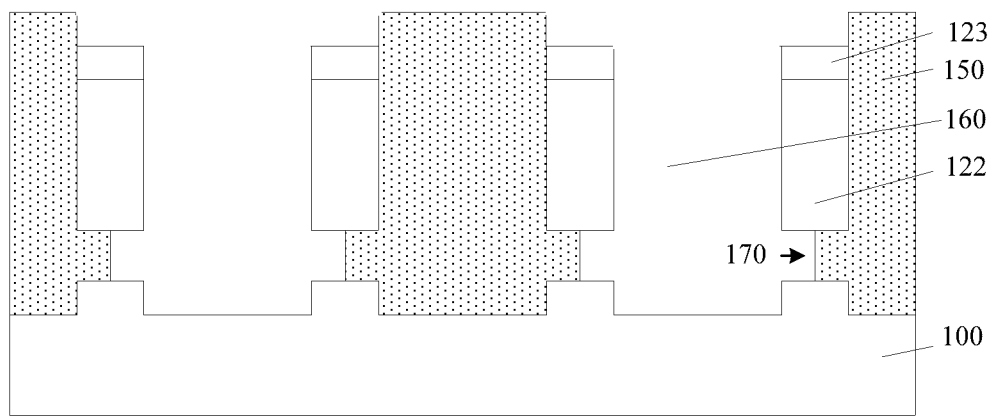

Referring to FIG. 7 and FIG. 10, after the second trenches 160 are formed, the sacrificial fin layer 131 is removed to form first fin openings 170 (S05).

Alternatively, the sacrificial fin layer 131 exposed by the second trenches 160 is removed to form the first fin openings 170.

The first fin openings 170 provide a space for subsequent formation of an isolation structure.

In one embodiment, after the sacrificial fin layer 131 is removed, the method further includes: removing the first mask layer 105 at a top of the fins 122.

After the first mask layer 105 on the top of the fins 122 is removed, a protective layer 123 on the top of the fins 122 is exposed.

In other embodiments, the first mask layer on the top of the fins 122 is removed before the sacrificial fin layer 131 is removed.

Referring to FIG. 10, the isolation structure is formed on the substrate 100 and in the first fin openings 170 (S06).

In one embodiment, the isolation structure covers a portion of sidewalls of the fins 122.

Figure 8:
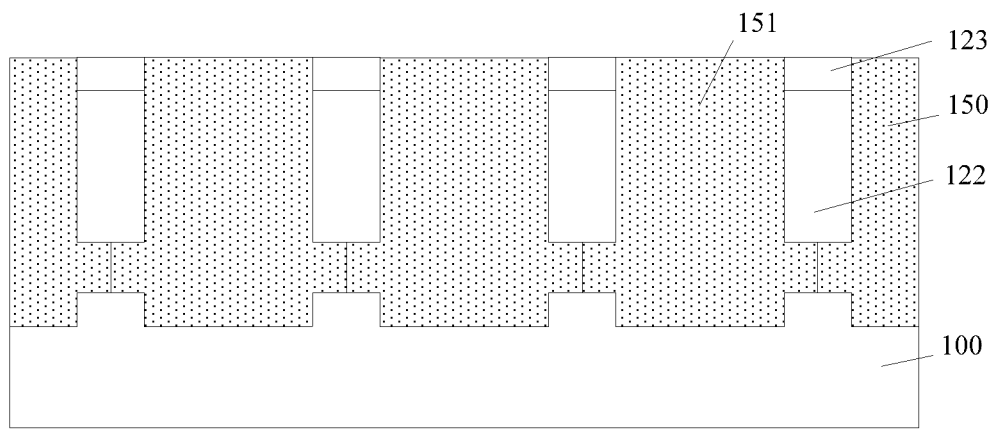

Referring to FIG. 8, after the fins 122 are formed and the first mask layer 105 is removed, a first isolation layer 151 is formed in the second trenches 160 and in the first fin openings 170.

A method of forming the first isolation layer 151 includes: forming a second isolation film (not shown) on the substrate 100, in the second trenches 160, and in the first fin openings 170, to cover the fins 122; and planarizing the second isolation film until a top of the fins 122 is exposed to form the first isolation layer 151.

In one embodiment, the first isolation layer 151 exposes a surface of the protective layer 123.

A process of forming a second isolation film is a deposition process such as a fluid chemical vapor deposition process. A second isolation film formed by the fluid chemical vapor deposition process has better filling performance.

The first isolation layer 151 provides a material layer for subsequently forming an isolation structure.

Figure 9:
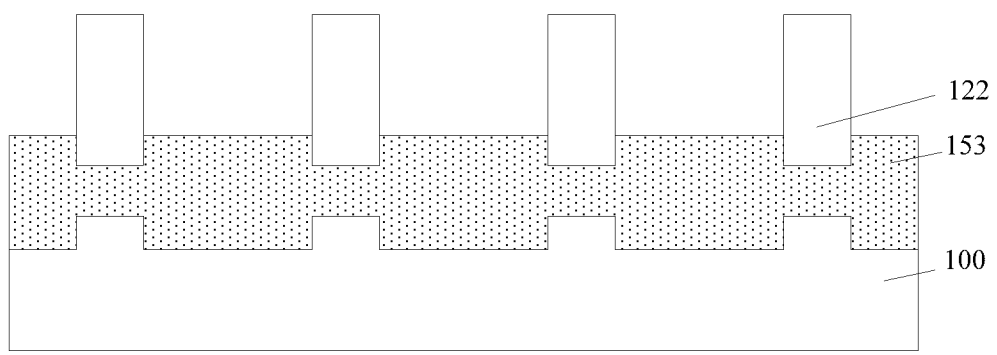

Referring to FIG. 9, after the first isolation layer 151 is formed, the first layer and the first isolation layer 151 are etched back to form an isolation structure 153, that the isolation structure 153 covers a portion of the sidewalls of the fins 122, and the isolation structure 153 fills the first fin openings 170.

A top surface of the isolation structure 153 is higher than a bottom surface of the fins 122.

The isolation stricture 153 is formed between the fins 122 and the substrate 100. The fins 122, the isolation structure 153, and the substrate 100 form a silicon structure on an insulating substrate. The silicon structure on the insulating substrate is formed on a conventional single-material substrate; therefore cost is low, because a single-material substrate is inexpensive. Moreover, the silicon structure on the insulating substrate is well integrated with other processes.

In another embodiment, a first layer is used as a sacrificial layer, and a method for forming an isolation structure includes: after fins are formed, forming a first isolation layer in second trenches and first fin openings; after the first isolation layer is formed, removing the first layer, exposing first trenches, and forming a second isolation layer in the first trenches; after the second isolation layer is formed, etching back the second isolation layer and the first isolation layer to form the isolation structure.

Correspondingly, one embodiment further provides a semiconductor device formed by the above method. Referring to FIG. 9, the semiconductor device includes: a substrate 100; fins 122 on the substrate 100, that first fin openings are formed between the fins 122 and the substrate 100; and an isolation structure 153 on the substrate 100, that the isolation structure 153 covers a portion of sidewall of the fins 122, and the isolation structure 153 fills the first fin openings.

Compared to the conventional fabrication methods, the technical solution of embodiments of the present disclosure has the following beneficial effects.

In the fabrication method of a semiconductor device provided by the present disclosure, a first layer is formed in first trenches, and the first layer supports fins after removing a sacrificial fin layer. First fin openings are located between a substrate and the fins, and an isolation structure is formed on the substrate and in the first fin openings. Having the isolation structure between the fins and the substrate, the fins, the isolation structure, and the substrate form a silicon structure on an insulating substrate. The silicon structure on the insulating substrate is formed on a conventional single-material substrate, therefore cost is low, because a single-material substrate is inexpensive. Moreover, the silicon structure on the insulating substrate is well integrated with other processes.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A semiconductor device, comprising:
a substrate, including a plurality of protrusions;
a plurality of fins formed over the substrate and aligned with the plurality of protrusions, wherein an orthographic projection of each of the plurality of fins and an orthographic projection of a corresponding protrusion of the plurality of protrusions on the substrate coincide with each other; and
an isolation structure, formed on the substrate and between the protrusions and the fins;
wherein a top surface of the isolation structure is higher than a bottom surface of each of the plurality of fins.

2. The device according to claim 1, wherein:
the substrate is made of monocrystalline silicon.

3. The device according to claim 1, wherein:
the isolation structure is made of one of silicon oxide, silicon nitride, silicon oxynitride, silicon borohydride, silicon oxynitride, and silicon oxynitride.

4. The device according to claim 1, wherein:
a thickness of a portion of the isolation structure between each of the plurality of fins and the corresponding protrusion of the plurality of protrusions is about 5 nm to about 100 nm.

5. The device according to claim 1, wherein:
the plurality of fins are made of a same material as the substrate.

6. The device according to claim 1, wherein:
a top surface of each of the plurality of fins is higher than the top surface of the isolation structure.

7. The device according to claim 6, wherein:
a bottom surface of the isolation structure is lower than a top surface of the corresponding protrusion of the plurality of protrusions.

\* \* \* \* \*